United States Patent
Fan et al.

(10) Patent No.: US 12,463,184 B2
(45) Date of Patent: Nov. 4, 2025

(54) ELECTRONIC DEVICE

(71) Applicant: Innolux Corporation, Miao-Li County (TW)

(72) Inventors: Chia-Chieh Fan, Miao-Li County (TW); Ming-Tsang Wu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 894 days.

(21) Appl. No.: 17/694,644

(22) Filed: Mar. 14, 2022

(65) Prior Publication Data

US 2022/0328460 A1    Oct. 13, 2022

Related U.S. Application Data

(60) Provisional application No. 63/172,722, filed on Apr. 9, 2021.

(30) Foreign Application Priority Data

Nov. 16, 2021  (CN) .......................... 202111358308.X

(51) Int. Cl.
  *H01L 25/075*   (2006.01)
  *H10H 20/854*   (2025.01)
  *H10H 20/857*   (2025.01)

(52) U.S. Cl.
  CPC ....... *H01L 25/0753* (2013.01); *H10H 20/854* (2025.01); *H10H 20/857* (2025.01)

(58) Field of Classification Search
  CPC .......................... H01L 25/0753; H10H 20/854; H10H 20/857; H10H 20/853
  See application file for complete search history.

(56) References Cited

U.S. PATENT DOCUMENTS

| | | | | |
|---|---|---|---|---|
| 2003/0071348 | A1* | 4/2003 | Eguchi | H01L 23/42 257/E23.092 |
| 2005/0122698 | A1* | 6/2005 | Ho | H05K 1/185 361/764 |
| 2006/0115931 | A1* | 6/2006 | Hsu | H01L 24/24 257/E23.178 |
| 2006/0231939 | A1* | 10/2006 | Kawabata | H01L 23/5385 257/E25.023 |

(Continued)

FOREIGN PATENT DOCUMENTS

TW     202029858     8/2020

OTHER PUBLICATIONS

"Office Action of Taiwan Counterpart Application", issued on Nov. 15, 2022, p. 1-p. 4.

Primary Examiner — Victor A Mandala
(74) Attorney, Agent, or Firm — JCIPRNET

(57) ABSTRACT

An electronic device is provided. The electronic device includes a supporting board, multiple circuit boards, a gap, and a molding material. The circuit boards are disposed on the supporting board. Each circuit board includes a substrate and multiple semiconductor elements. The semiconductor elements are disposed on the substrate. The gap is disposed between two adjacent circuit boards. The molding material is disposed on the supporting board and covers the circuit boards and the gap. The electronic device of the embodiment of the disclosure can improve uniformity of product appearance or uniformity of a display image.

19 Claims, 2 Drawing Sheets

(56) References Cited

U.S. PATENT DOCUMENTS

| | | | |
|---|---|---|---|
| 2006/0270109 A1* | 11/2006 | Blaszczak | H05K 3/303 |
| | | | 257/E23.126 |
| 2020/0075820 A1 | 3/2020 | Han et al. | |
| 2020/0388636 A1* | 12/2020 | Yueh | H01L 25/0655 |
| 2022/0059015 A1* | 2/2022 | Su | G09G 3/2096 |
| 2022/0059607 A1* | 2/2022 | Murugan | H10H 20/853 |
| 2022/0059608 A1* | 2/2022 | Tseng | H10H 20/857 |
| 2022/0262847 A1* | 8/2022 | Huang | H01L 25/0753 |
| 2024/0365623 A1* | 10/2024 | Hu | H10K 59/18 |
| 2025/0063877 A1* | 2/2025 | Chae | H10H 20/018 |

\* cited by examiner

ELECTRONIC DEVICE

CROSS-REFERENCE TO RELATED APPLICATION

This application claims the priority benefit of U.S. Provisional Application No. 63/172,722, filed on Apr. 9, 2021 and China Application No. 202111358308.X, filed on Nov. 16, 2021. The entirety of each of the above-mentioned patent applications is hereby incorporated by reference herein and made a part of this specification.

BACKGROUND

Technical Field

The disclosure relates to an electronic device, and particularly relates to an electronic device that can improve uniformity of product appearance.

Description of Related Art

Electronic devices or splicing electronic devices have been widely used in mobile phones, televisions, monitors, tablets, vehicle displays, wearable devices, and desktop computers. With the vigorous development of electronic devices, the quality requirements of electronic devices are becoming higher.

SUMMARY

The disclosure provides an electronic device, which can improve uniformity of product appearance.

According to some embodiments of the disclosure, an electronic device includes a supporting board, multiple circuit boards, a gap, and a molding material. The circuit boards are disposed on the supporting board. Each circuit board includes a substrate and multiple semiconductor elements. The semiconductor elements are disposed on the substrate. The gap is disposed between two adjacent circuit boards. The molding material is disposed on the supporting board and covers the circuit boards and the gap.

BRIEF DESCRIPTION OF THE DRAWINGS

The accompanying drawings are included to provide a further understanding of the disclosure, and the accompanying drawings are incorporated in and constitute a part of the specification. The accompanying drawings illustrate embodiments of the disclosure and serve to explain the principles of the disclosure together with the description.

DETAILED DESCRIPTION OF DISCLOSED EMBODIMENTS

Figure 1:
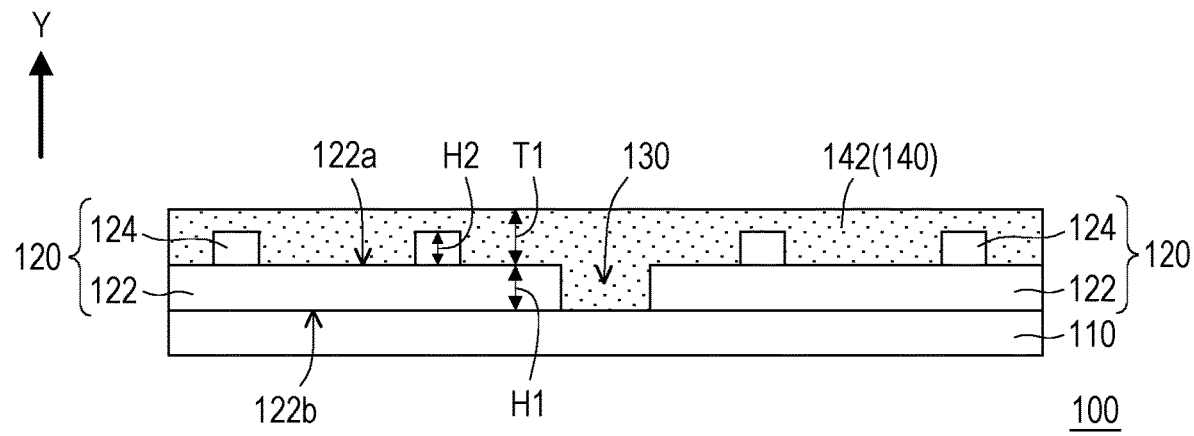
FIG. 1 is a schematic partial cross-sectional view of an electronic device according to some embodiments of the disclosure.

The disclosure may be understood by referring to the following detailed description in conjunction with the accompanying drawings. It should be noted that in order to be easily understood by the user and simplify the accompanying drawings, only a part of an electronic device is drawn in multiple accompanying drawings of the disclosure, and specific elements in the accompanying drawings are not drawn to actual scales. In addition, the number and size of each element in the drawings are only schematic and are not intended to limit the scope of the disclosure.

In the following description and claims, words such as "containing" and "including" are open-ended words, which should be interpreted as having the meaning of "containing but not limited to . . . ".

It should be understood that when an element or a film layer is referred to as being "on" or "connected to" another element or film layer, the element or the film layer may be directly on the another element or film layer or directly connected to the another element or film layer, or there is an element or a film layer inserted between the two (in the case of indirect connection). On the contrary, when an element is referred to as being "directly on" or "directly connected to" another element or film layer, there is no element or film layer inserted between the two.

Although terms such as "first", "second", and "third" may be used to describe various constituent elements, the constituent elements are not limited to the terms. The terms are only used to distinguish a single constituent element from other constituent elements in the specification. The same terms may not be used in the claims and may be replaced by first, second, third, etc. according to a declared order of elements in the claims. Therefore, in the following specification, a first constituent element may be a second constituent element in the claims.

In the disclosure, a length, a width, a thickness, a height, or an area, or a distance or a spacing between elements may be measured by adopting optical microscopy (OM), scanning electron microscope (SEM), thin film thickness profile measuring instrument ($\alpha$-step), ellipse thickness gauge, or other suitable manners. In detail, according to some embodiments, the scanning electron microscope may be used to obtain a cross-sectional structural image of an element to be measured, and measure the width, thickness, height, or area of each element, or the distance or spacing between the elements, but not limited thereto. In addition, there may be a certain error between any two values or directions for comparison.

In the text, the terms "about", "approximately", "substantially", and "roughly" usually represent within 10%, 5%, 3%, 2%, 1%, or 0.5% of a given value or range. The given number here is an approximate number, that is, in the case where "about", "approximately", "substantially", and "roughly" are not specifically described, the meaning of "about", "approximately", "substantially", and "roughly" may still be implied.

In some embodiments of the disclosure, terms related to bonding and connection, such as "connect" and "interconnect", unless specifically defined, may refer to that two structures are in direct contact or two structures are not in direct contact, wherein another structure is disposed between the two structures. Also, the terms related to bonding and connection may also include cases where the two structures are both movable or the two structures are both fixed. In addition, the term "coupling" contains any direct and indirect electrical connection means.

The electronic device of the disclosure may include a display device, a backlight device, an antenna device, a sensing device, or a splicing device, but not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing device may be a sensing device that senses capacitance, light, heat, or ultrasound, but not limited thereto. The electronic element may include a passive element and an active element, such as a capacitor, a resistor, an inductor, a diode, and a transistor. The diode may include a light emitting diode (LED) or a photodiode. The light emitting diode may include, for example, an organic LED (OLED), a mini LED, a micro LED, or a quantum dot LED, but not limited thereto. The splicing device may be, for example, a display splicing device or an antenna splicing device, but not limited thereto. It should be noted that the electronic device may be any combination of the foregoing, but not limited thereto. Hereinafter, the display device will be used as the electronic device or the splicing device to illustrate the content of the disclosure, but the disclosure is not limited thereto.

It should be noted that in the following embodiments, under the premise of not departing from the spirit of the disclosure, the features in several different embodiments may be replaced, reorganized, and mixed to complete other embodiments. As long as the features of the embodiments do not violate or conflict with the spirit of the invention, the embodiments may be mixed and matched arbitrarily.

Reference will now be made in detail to the exemplary embodiments of the disclosure, and examples of the exemplary embodiments are illustrated in the accompanying drawings. Whenever possible, the same reference numerals are used in the accompanying drawings and the description to represent the same or similar parts.

FIG. 1 is a schematic partial cross-sectional view of an electronic device according to some embodiments of the disclosure.

Please refer to FIG. 1. An electronic device 100 of the embodiment includes a supporting board 110, multiple circuit boards 120, a gap 130, and a molding material 140. The circuit boards 120, the gap 130, and the molding material 140 are all disposed on the supporting board 110. The supporting board 110 may be a rigid substrate, a soft substrate, or a combination of the foregoing. For example, the material of the supporting board 110 may include glass, quartz, sapphire, ceramics, polycarbonate (PC), polyimide (PI), polyethylene terephthalate (PET), other suitable substrate materials, or a combination of the foregoing, but not limited thereto. In some embodiments, the material of the supporting board 110 may also be a soft material.

In the embodiment, the circuit boards 120 are disposed on the supporting board 110. The circuit boards 120 are, for example, spliced on the supporting board 110 in an array arrangement, but not limited thereto. Each circuit board 120 may include a substrate 122 and multiple semiconductor elements 124. Specifically, the substrate 122 has a first surface 122a and a second surface 122b opposite to the first surface 122a. The semiconductor elements 124 are respectively disposed on the first surface 122a of the substrate 122. The supporting board 110 is disposed on the second surface 122b of the substrate 122. The semiconductor element 124 and the supporting board 110 are respectively located on two opposite sides of the substrate 122. The supporting board 110 may contact the second surface 122b of the substrate 122, but not limited thereto. In the embodiment, the substrate 122 may be regarded as a driving substrate including a driving circuit (not shown) such as a transistor, a scan line and a data line, and the substrate 122 may be electrically connected to the semiconductor element 124 to drive the semiconductor element 124. The substrate 122 has a height H1, and the height H1 is, for example, a maximum height of the substrate 122 measured along a normal direction Y of the supporting board 110. The material of the substrate 122 may be the same or different from the material of the supporting board 110, so the description is not repeated here. In some embodiments, the material of the substrate 122 may also be a soft material.

In the embodiment, the semiconductor element 124 may include a passive element and an active element, such as a light emitting element and a diode, but not limited thereto. The light emitting element may include an inorganic light emitting diode, an organic light emitting diode, a mini light emitting diode, a micro light emitting diode, a quantum dot light emitting diode, other suitable light emitting elements, or combination thereof. For example, light emitting diodes with different colors, such as a red light emitting diode, a green light emitting diode, or a blue light emitting diode, but not limited thereto. The semiconductor element 124 has a height H2, and the height H2 is, for example, a maximum height of the semiconductor element 124 measured along the normal direction Y of the supporting board 110.

In the embodiment, the gap 130 is disposed between two adjacent circuit boards 120. The gap 130 may be a seam located between the circuit boards 120 when the splicing circuit boards 120, but not limited thereto.

In the embodiment, the molding material 140 is disposed on the supporting board 110. The molding material 140 may cover the circuit boards 120 and the gap 130 to protect the plurality of circuit boards 120. The molding material 140 can contact the circuit boards 120. The molding material 140 may be further located in the gap 130 or further fill and close the gap 130. In the embodiment, the molding material 140 may fill and close the gap 130, thereby reducing product appearance or optical performance defects due to formation of bubbles in the gap 130, which further serves as one of the advantages of the disclosure.

In the embodiment, a thickness T1 of the molding material 140 may be, for example, greater than or equal to a height H2 of one of the semiconductor elements 124, so that the molding material 140 may surround and protect the semiconductor element 124, but not limited thereto. The thickness T1 may be, for example, a minimum thickness of the molding material 140 measured along the normal direction Y of the supporting board 110, and the thickness T1 may also be, for example, a distance between a surface of the molding material 140 away from the substrate 122 and the first surface 122a of the substrate 122 measured along the normal direction Y of the supporting board 110.

In the embodiment, the method of forming the molding material 140 may include, for example, jetting, dispensing, printing, or other suitable processes, but not limited thereto. In the embodiment, the molding material 140 may have a molding film layer 142. The molding film layer 142 may have a single-layer structure or a multi-layer structure. The material of the molding film layer 142 may include acrylate, epoxy, epoxy acrylate, cyanoacrylate, or polyurethane acrylate, but not limited thereto. In some embodiments, the material of the molding material 140 may also be a soft material.

In the embodiment, the electronic device 100 may be a splicing device and may be a flexible device, such as a rollable display, but not limited thereto.

Other embodiments will be listed below for illustration. It must be noted here that the following embodiments continue to use the reference numerals and some content of the foregoing embodiment, wherein the same reference numerals are adopted to represent the same or similar elements, and the description of the same technical content is omitted. For the description of the omitted parts, reference may be made to the foregoing embodiment, and the description will not be repeated in the following embodiments.

Figure 2:
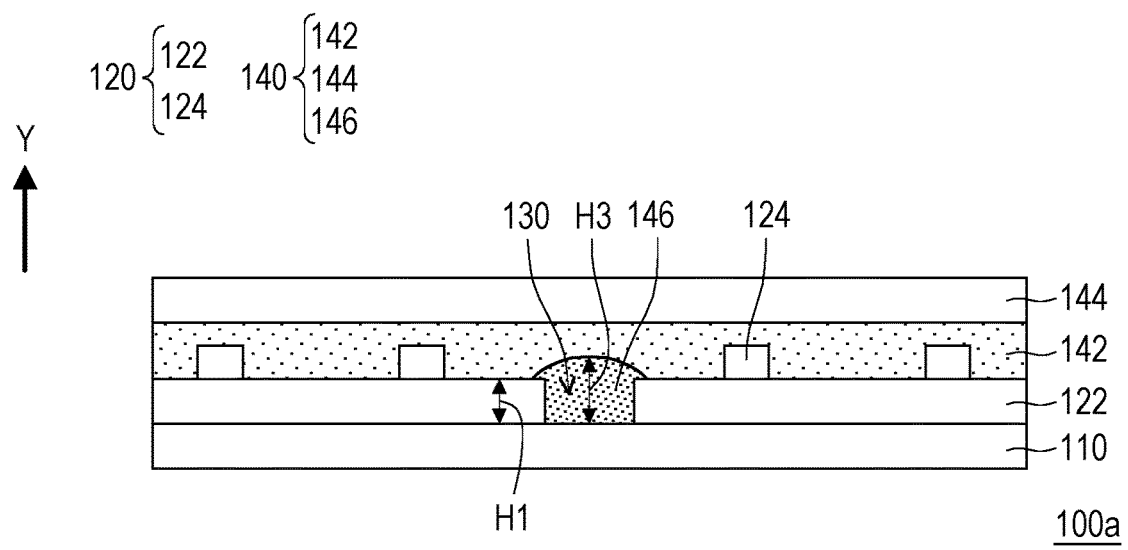
FIG. 2 is a schematic partial cross-sectional view of an electronic device according to some embodiments of the disclosure.

FIG. 2 is a schematic partial cross-sectional view of an electronic device according to some embodiments of the disclosure. Please refer to FIG. 1 and FIG. 2 at the same time. An electronic device 100a of the embodiment is roughly similar to the electronic device 100 of FIG. 1. Therefore, the same and similar components in the two embodiments are not repeated here. One of the differences between the electronic device 100a of the embodiment and the electronic device 100 is that in the electronic device 100a of the embodiment, the molding material 140 may have a molding sheet layer 144 and a filler 146.

Please refer to FIG. 2. In the embodiment, the molding sheet layer 144 is disposed on a surface of the molding film layer 142 away from the substrate 122. The molding sheet layer 144 and the substrate 122 are respectively located on two opposite sides of the molding film layer 142.

The molding sheet layer 144 may have a single-layer structure or a multi-layer structure. The material of the forming sheet layer 144 may include polyethylene terephthalate, polycarbonate, polyurethane (PU), polyimide, tri-acetyl cellulose (TAC), cyclo olefin polymer (COP), poly(methyl methacrylate) (PMMA), a metal material (such as steel SUS), but not limited thereto. In the embodiment, the Young's modulus of the molding film layer 142 is, for example, less than or equal to the Young's modulus of the molding sheet layer 144 to buffer stress, but not limited thereto.

The filler 146 is disposed in the gap 130 and may support the molding film layer 142. The filler 146 has a height H3, and the height H3 is, for example, a maximum height of the filler 146 measured along the normal direction Y of the supporting board 110. In the embodiment, the height H3 of the filler 146 may be, for example, greater than or equal to the height H1 of the substrate 122. In the embodiment, the filler 146 may further fill and close the gap 130, thereby reducing product appearance or optical performance defects due to the formation of bubbles in the gap 130, which further serves as one of the advantages of the disclosure.

In the embodiment, the material of the filler 146 may include a transparent material or a light shielding material, but not limited thereto. In addition, the material of the filler 146 and the material of the molding film layer 142 may be the same or different.

One of the differences between the electronic device of some embodiments of the disclosure and the electronic device 100a is that the molding material 140 may further have the molding sheet layer 144 while the filler 146 may be omitted. The forming sheet layer 144 may be disposed on the surface of the molding film layer 142 away from the substrate 122. The molding sheet layer 144 and the substrate 122 are respectively located on two opposite sides of the molding film layer 142.

One of the differences between the electronic device of some embodiments of the disclosure and the electronic device 100a is that the molding material 140 may further have the filler 146 while the molding sheet layer 144 may be omitted. The filler 146 is disposed in the gap 130 and further supports the molding film layer 142.

Figure 3A:
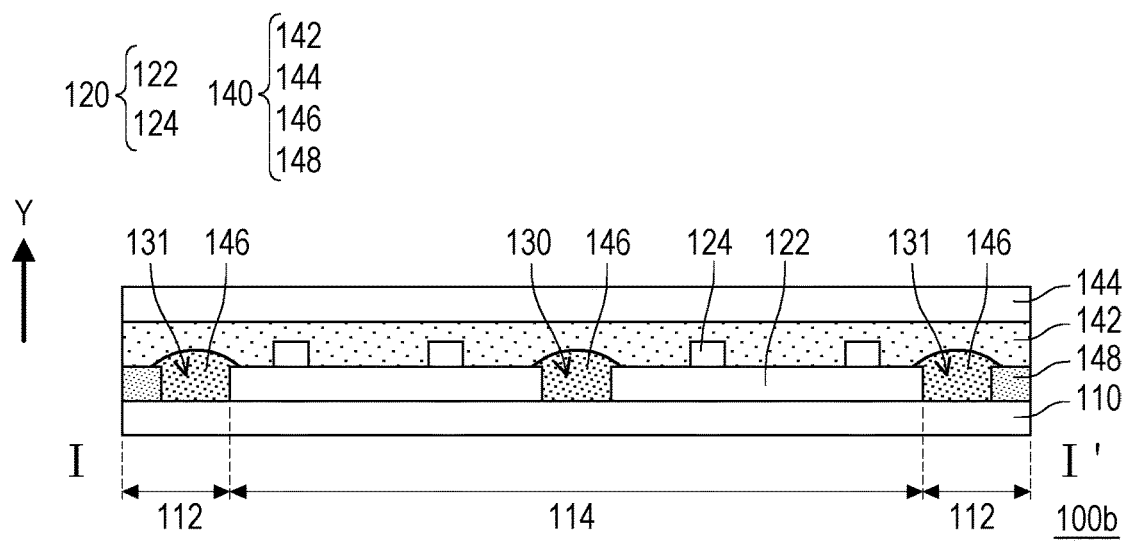
FIG. 3A is a schematic partial cross-sectional view of an electronic device according to some embodiments of the disclosure.
Figure 3B:
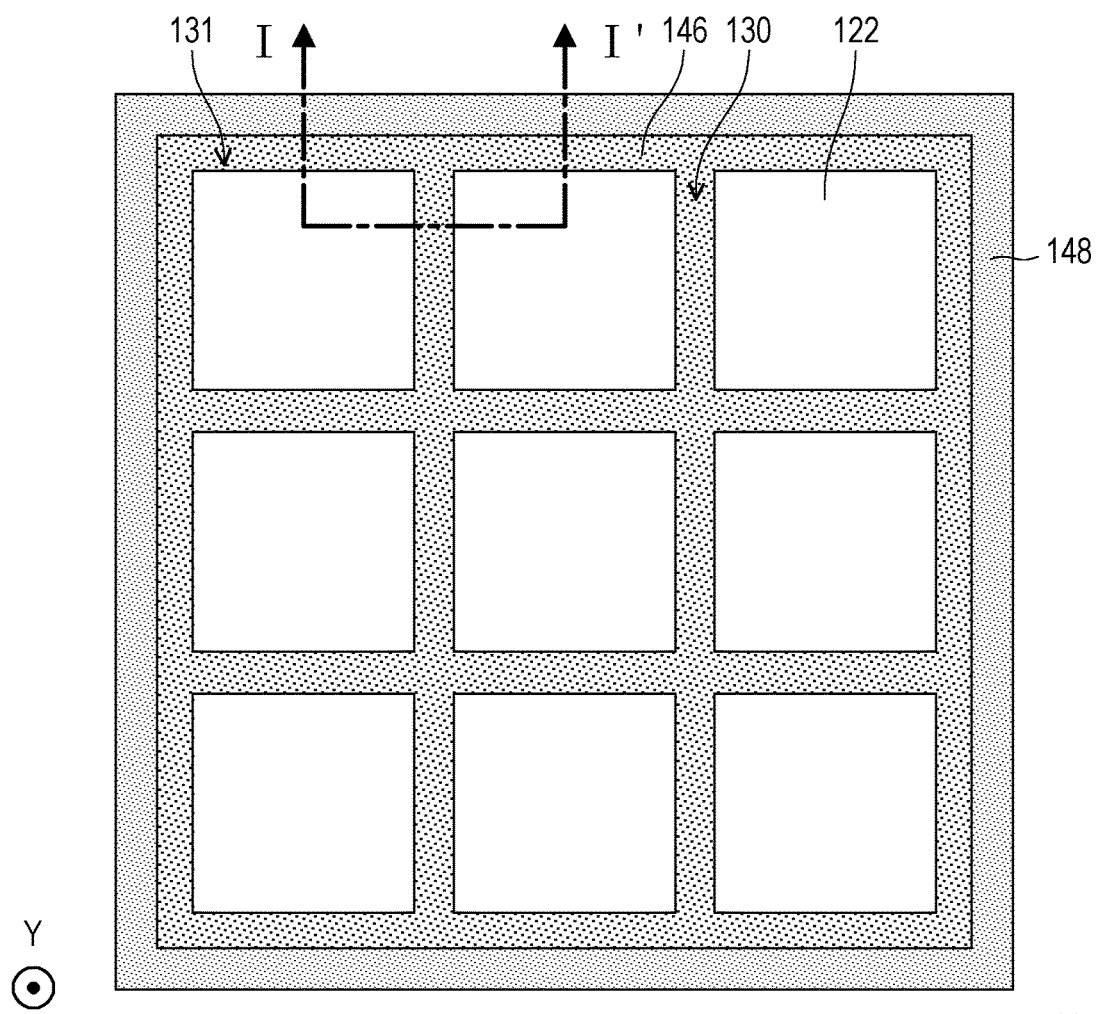
FIG. 3B is a schematic partial top view of the electronic device of FIG. 3A.

FIG. 3A is a schematic partial cross-sectional view of an electronic device according to some embodiments of the disclosure, and FIG. 3A is a schematic cross-sectional view of the electronic device of FIG. 3B along a section line I-I'.

FIG. 3B is a schematic partial top view of the electronic device of FIG. 3A. For clarity of the drawings and ease of description, FIG. 3B omits several elements, including the semiconductor element 124, the molding film layer 142, and the molding sheet layer 144, in the electronic device. Please refer to FIG. 2, FIG. 3A, and FIG. 3B at the same time. An electronic device 100b of the embodiment is roughly similar to the electronic device 100a of FIG. 2. Therefore, the same and similar components in the two embodiments are not repeated here. One of the differences between the electronic device 100b of the embodiment and the electronic device 100a is that in the electronic device 100b of the embodiment, the molding material 140 may further have a spacer 148, wherein the spacer 148 may fix the product appearance, support the product strength, etc.

Please refer to FIG. 3A and FIG. 3B. In the embodiment, the spacer 148 is disposed along a periphery of the supporting board 110. Specifically, the supporting board 110 has a peripheral region 112 and a non-peripheral region 114. The peripheral region 112 is disposed along the periphery of the supporting board 110. The peripheral region 112 is adjacent to the non-peripheral region 114, and the peripheral region 112 may roughly surround the non-peripheral region 114. The spacer 148 may be continuously disposed on the peripheral region 112 of the supporting board 110, but not limited thereto. In some embodiments, the spacer 148 may also be discontinuously disposed on the peripheral region 112 of the supporting board 110. For example, please refer to FIG. 3B. In the partial top view of the electronic device, the supporting board 110 has 4 edges, and the spacer 148 may be disposed on one, two, or three of the edges (not shown) of the supporting board 110. In the embodiment, the circuit boards 120 are disposed on the non-peripheral region 114 of the supporting board 110. The spacer 148 may roughly surround the circuit boards 120, and the spacer 148 does not contact the circuit boards 120. The material of the spacer 148 may be, for example, an insulating material, metal material, alloy material, other suitable materials, or a combination of the foregoing, but not limited thereto. In some embodiments, the material of the spacer 148 may be, for example, engineering plastic or stainless steel. In some embodiments, the material of the spacer 148 may be stainless steel for special use. In some embodiments, the material of the spacer 148 and the material of the molding film layer 142 may be the same or different. In some embodiments, the modulus of the spacer 148 may be greater than 1.5 MPa, but not limited thereto.

In the embodiment, the number of gaps 130 and 131 is plural. The gap 130 is located between two adjacent circuit boards 120, and the gap 131 is located between the spacer 148 and the circuit board 120 adjacent to the spacer 148. The size (for example, a distance between two adjacent circuit boards 120) of the gap 130 may be roughly the same or similar to the size (for example, a distance between the spacer 148 and the adjacent circuit board 120) of the gap 131, but not limited thereto. In some embodiments, the size of the gap 130 may be different from the size of the gap 131 (not shown).

The filler 146 is disposed in the gap 130 and the gap 131, and may fill and close the gap 130 and the gap 131. In the embodiment, the filler 146 may further fill and close the gap 130 and the gap 131, thereby reducing product appearance or optical performance defects due to the formation of bubbles in the gap 130 and the gap 131, which further serves as one of the advantages of the disclosure.

In summary, in the electronic device of many embodiments of the disclosure, since the molding material may cover the gap, the objective of improving uniformity of product appearance can be achieved. The disclosure can further have several advantages such as improving uniformity of product appearance or uniformity of a display image. Firstly, in one of the embodiments, the thickness of the molding material may be greater than or equal to the height of one of the semiconductor elements, so that the molding material may surround and protect the semiconductor element. Secondly, in one of the embodiments, the height of the filler may be greater than or equal to the height of the substrate, so that the filler may fill and close the gap, thereby reducing product appearance or optical performance defects due to the formation of bubbles in the gap and improving uniformity of product appearance or uniformity of the display image.

Finally, it should be noted that the foregoing embodiments are only used to illustrate, but not to limit, the technical solutions of the disclosure. Although the disclosure has been described in detail with reference to the foregoing embodiments, persons skilled in the art should understand that they can still modify the technical solutions described in the foregoing embodiments or equivalently replace some or all of the technical features. However, the modifications or replacements do not cause the essence of the corresponding technical solutions to deviate from the scope of the technical solutions of the embodiments of the disclosure.

What is claimed is:

1. An electronic device, comprising:
   a supporting board;
   a plurality of circuit boards, disposed on the supporting board, and each of the circuit boards comprising:
      a substrate; and
      a plurality of semiconductor elements, disposed on the substrate;
   a gap, disposed between two adjacent circuit boards; and
   a molding material, disposed on the supporting board and covering the circuit boards and the gap,
   wherein the molding material has a spacer, and the spacer is disposed along a periphery of the supporting board.

2. The electronic device according to claim 1, wherein the molding material has a molding film layer.

3. The electronic device according to claim 2, wherein the molding film layer has a multi-layer structure.

4. The electronic device according to claim 2, wherein the molding material further has a filler, the filler is disposed in the gap, and materials of the filler and the molding film layer are different.

5. The electronic device according to claim 2, wherein the molding material further has a molding sheet layer disposed on the molding film layer.

6. The electronic device according to claim 5, wherein a Young's modulus of the molding film layer is less than or equal to a Young's modulus of the molding sheet layer.

7. The electronic device according to claim 5, wherein the molding sheet layer and the substrate are respectively located on two opposite sides of the molding film layer.

8. The electronic device according to claim 5, wherein the molding sheet layer has a multi-layer structure.

9. The electronic device according to claim 5, wherein the molding material further has a filler, the filler is disposed in the gap, and materials of the filler and the molding film layer and/or the molding sheet layer are different.

10. The electronic device according to claim 9, wherein a height of the filler is greater than or equal to a height of the substrate.

11. The electronic device according to claim 9, wherein the filler fills and closes the gap.

12. The electronic device according to claim 1, wherein the molding material is disposed in the gap.

13. The electronic device according to claim 1, wherein the spacer is discontinuously disposed.

14. The electronic device according to claim 1, wherein a number of the gap is plural, and one of the gaps is located between the spacer and a substrate adjacent to the spacer.

15. The electronic device according to claim 1, wherein the molding material has a filler, and the filler is disposed in the gap.

16. The electronic device according to claim 1, wherein the substrate has a first surface and a second surface, the semiconductor elements are disposed on the first surface of the substrate, and the supporting board is disposed on and contacts the second surface of the substrate.

17. The electronic device according to claim 1, wherein a thickness of the molding material is greater than or equal to a height of one of the semiconductor elements.

18. The electronic device according to claim 1, wherein at least one of the substrate, the supporting board, and the molding material has a flexible material.

19. The electronic device according to claim 1, wherein the molding material fills and closes the gap.

* * * * *